(12) United States Patent
Ramakrishnan et al.

(10) Patent No.: US 10,971,450 B2
(45) Date of Patent: Apr. 6, 2021

(54) HEXAGONALLY ARRANGED CONNECTION PATTERNS FOR HIGH-DENSITY DEVICE PACKAGING

(71) Applicant: Avago Technologies International Sales Pte. Limited, Singapore (SG)

(72) Inventors: Arun Ramakrishnan, Irvine, CA (US); Reza Sharifi, Irvine, CA (US); Dharmendra Saraswat, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 90 days.

(21) Appl. No.: 16/250,394

(22) Filed: Jan. 17, 2019

(65) Prior Publication Data

US 2020/0235052 A1    Jul. 23, 2020

(51) Int. Cl.
*H01L 23/528* (2006.01)
*H01L 23/00* (2006.01)

(52) U.S. Cl.
CPC .......... *H01L 23/5286* (2013.01); *H01L 24/25* (2013.01); *H01L 2924/14* (2013.01); *H01L 2924/15311* (2013.01)

(58) Field of Classification Search
CPC ....... H01L 23/5286; H01L 2924/15311; H01L 2924/14; H01L 24/25; H01L 2924/00; H01L 23/5386; H01L 25/167; H01L 24/16; H01L 2224/732; H01L 2224/53; H01L 2224/73204; H01L 2224/16235; H01L 2224/16227; H01L 24/32; H01L 2224/32225; H01L 2224/32245; H01L 2924/163; H01L 2924/1615; H01L 2924/02; H01L 23/49838; H01L 23/49816
See application file for complete search history.

(56) References Cited

U.S. PATENT DOCUMENTS

2006/0208348 A1* 9/2006 Ohsaka ............... H01L 25/0657
257/685
2008/0258259 A1* 10/2008 Osaka ..................... H01L 24/73
257/532

* cited by examiner

*Primary Examiner* — Jasmine J Clark
(74) *Attorney, Agent, or Firm* — Morgan, Lewis & Bockius LLP

(57) ABSTRACT

Hexagonally arranged connection patterns for device packaging allow high density circuitry dies to be assembled into packages of manufacturable size. The connection patterns may be patterns for solder ball arrays or other types of connection mechanisms under a semiconductor package. Despite the increased density of the connection patterns, the connection patterns meet the demanding crosstalk specifications for high speed operation of the high density circuitry.

20 Claims, 4 Drawing Sheets

US 10,971,450 B2

HEXAGONALLY ARRANGED CONNECTION PATTERNS FOR HIGH-DENSITY DEVICE PACKAGING

BACKGROUND

Field

This disclosure relates to semiconductor packaging. This disclosure also relates to connection patterns and ball grid and/or pin patterns for semiconductor packages.

Description of the Related Art

Rapid advances in electronics, networking and communication technologies, driven by immense customer demand, have resulted in the widespread adoption of electronic devices of every kind. The fabrication processes that create the device circuitry on semiconductor (integrated circuit) dies have transitioned through many different manufacturing process nodes in the last four decades, from 6 μm processes in the mid-1970s to 7 nm processes at the time of this writing. The ever increasing density, functionality, and complexity of the circuitry has given rise to significant challenges with the semiconductor packaging that carries the integrated circuit dies, including challenges with mechanically and electrically connecting the semiconductor packaging to external system circuitry.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
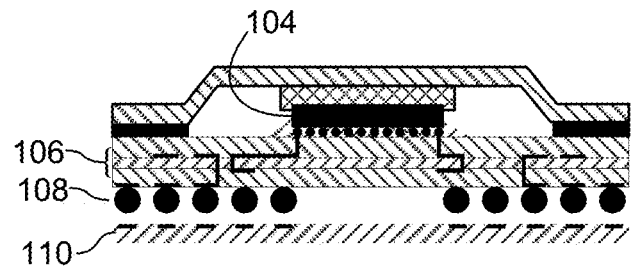
FIG. 1 illustrates a simplified example of a semiconductor package.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in simplified form in order to avoid obscuring the concepts of the subject technology.

Referring now to the drawings, wherein like reference numerals designate identical or corresponding parts throughout the several views, exemplary aspects of the disclosure include connection patterns and ball/pin patterns for device packaging. The connection patterns and ball/pin patterns for device packaging that are discussed below allow high density integrated circuit dies to be assembled into packages of manufacturable size. The connection patterns may be patterns for solder ball arrays or other types of electrical connection mechanisms under a semiconductor package. Despite the increased density of the connection patterns, the connection patterns still meet the demanding crosstalk and other signal integrity specifications for high speed transmit and receive signaling performed through the connection pattern to and from the high density circuitry on the die within the packaging.

FIG. 1 illustrates a simplified example of a semiconductor package. FIG. 1 shows a package cross section 100 including circuit layers defined on substrates that may be bonded together and that may use, for example, vias to interconnect the circuit layers. The package cross section 100 shows an integrated circuit die 104 bonded to a first surface of a group of interconnecting circuit layers 106. The interconnecting circuit layers 106 connect to an array of electrically conductive connective elements 108 arranged in groups of connection patterns, for example, on a second surface of the interconnecting circuit layers 106. In some embodiments, the connective elements 108 may be in the form a ball grid array (BGA) of solder balls as the connective elements 108 through which the package is soldered to land patterns on a printed circuit board (PCB) 110. The principles discussed below are applicable to other types of connection patterns composed of other types of electrically conductive connective elements, including pin grid arrays (PGAs) of pins, land grid arrays (LGAs) of planar metal contacts, and other types of connection mechanisms. Furthermore, the principles discussed below are applicable to any circuitry subject to signal performance specifications, in addition to the specific types of networking and communication circuits described below.

Allocating signal connections, power connections, and ground connections to the connection points (whether solder balls, pins, or lands) within a connection pattern is a significant technical challenge for high speed circuits. For instance, high speed serializer/deserializer (SerDes) cores, used in networking and communications devices, must meet stringent specifications for signal performance to ensure reliable operation, specifically far-end and near-end crosstalk (FEXT and NEXT) specifications. Additional signal performance specifications that may be applicable include transmit (Tx) and receive (Rx) return loss (RL), Tx and Rx common mode (CM) RL, insertion loss (IL) and Tx and Rx FEXT measured at the PCB.

A significant complication to the allocation of signals is that the overall package size must be kept to a manufacturable size, but increasing the density of the connection pattern to reduce the package size may adversely affect signal performance. As circuit speed increases, the signal specifications become more severe, and as the number of circuit cores on a die in a package increase, the challenge of finding a viable connection pattern that is manufacturable and that meets the required signal integrity specifications becomes extremely difficult. Note also that achieving a smaller package size also significantly reduces manufacturing costs. Reducing package size from 75 mm to 70 mm, for instance, may result in per-package savings on the order of $20.

Another factor influencing signal specifications is the effective receive distance with regard to signals sent from a communication partner to the package, for example, over circuit traces on a PCB. The effective distances are sometimes categorized as long reach or short reach. An insertion loss of 30 dB or better between the package and a communication partner may represent a short reach, while an insertion loss of greater than 30 dB may represent a long reach. For short reach implementations, the receive signal specifications typically allow greater cross talk because the received signals are stronger, while long reach implementations need to meet a more conservative receive cross talk specification because the received signals are weaker and more readily corrupted by noise and interference.

Figure 2:
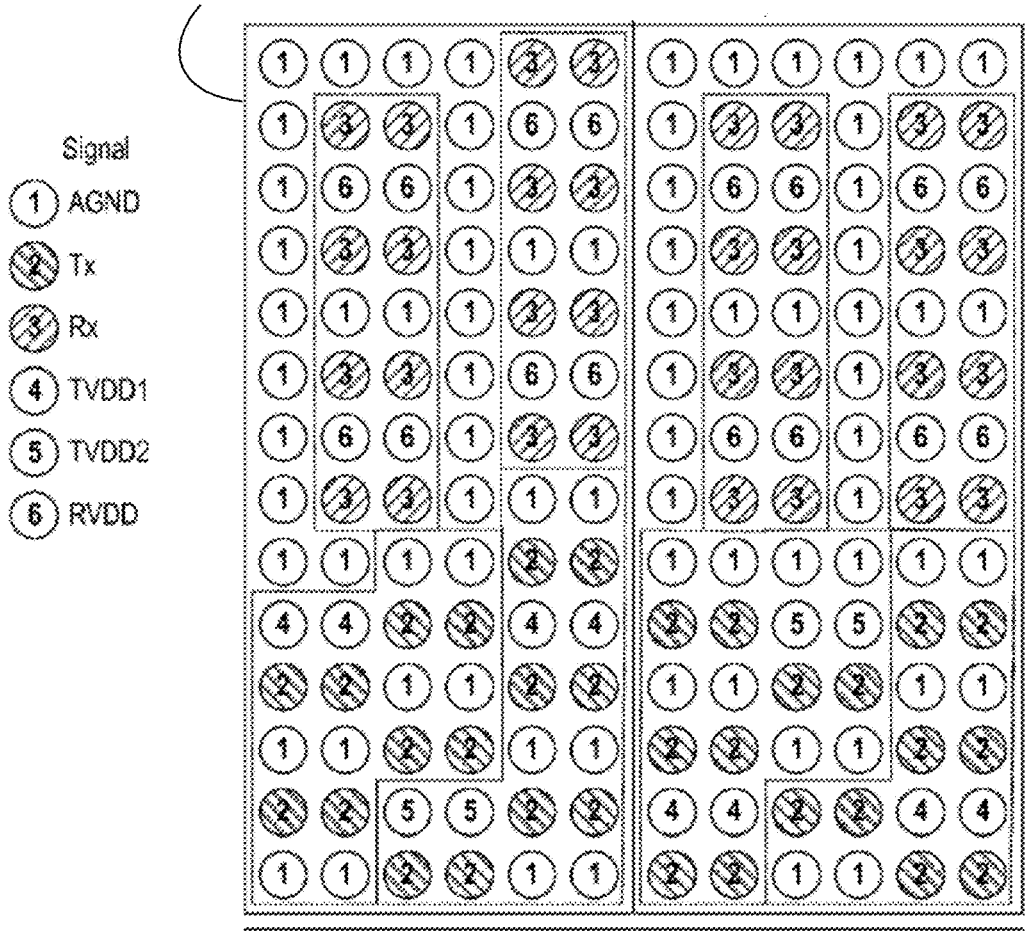
FIG. 2 illustrates a prior art connection pattern.

FIG. 2 illustrates a prior art connection pattern 200 for four adjacent SerDes core instances. The example illustrated in FIG. 2 assumes that each SerDes core instance includes four differential Tx pairs and four differential Rx pairs (four lanes), one or more power supplies, and ground signals. Prior art connection patterns, such as that illustrated in FIG. 2, may not accommodate large numbers of, for example, 128 four-lane SerDes cores in body sizes less than about 75 mm.

Figure 3:
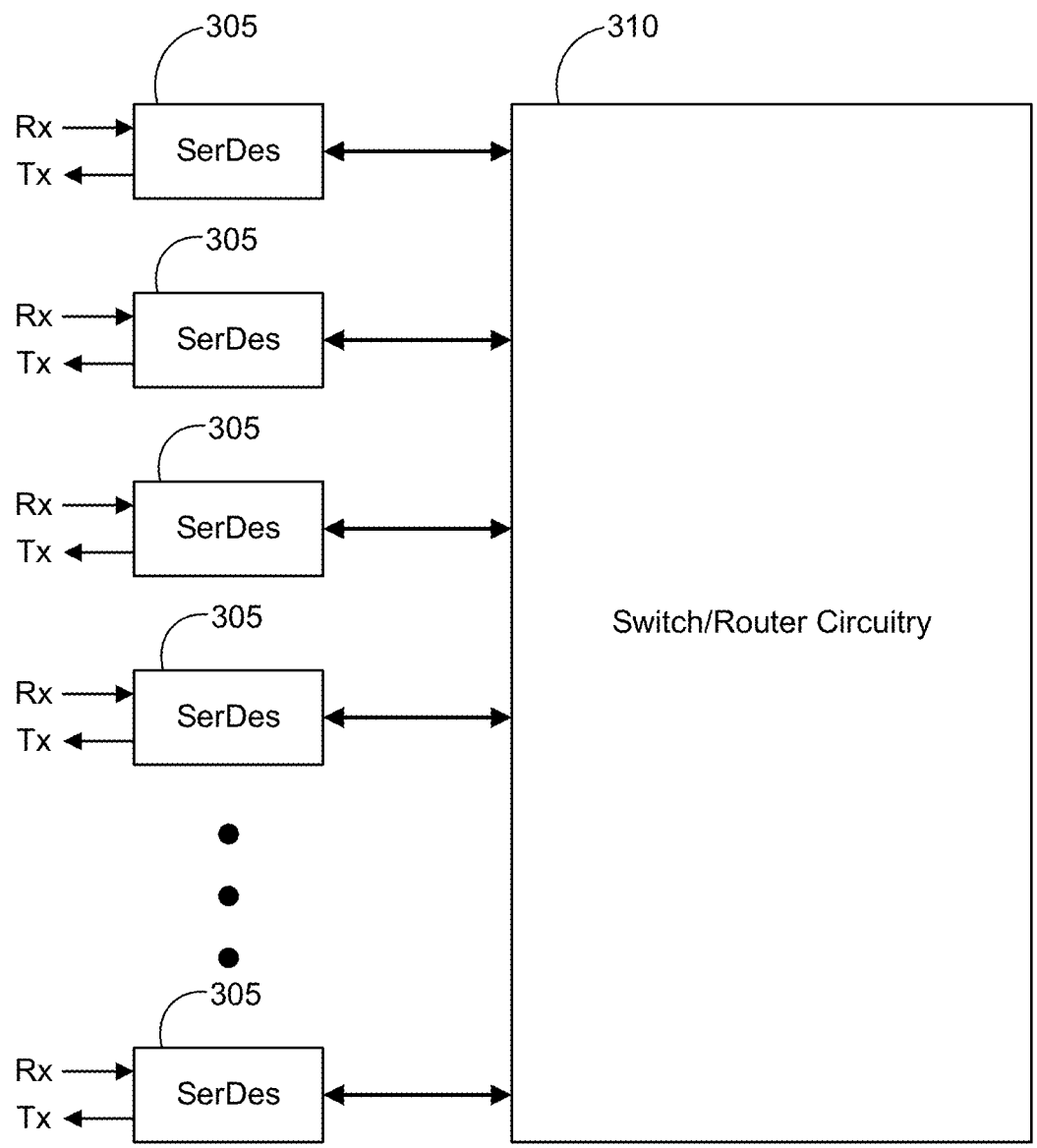
FIG. 3 illustrates a simplified functional block diagram of an integrated circuit architecture according to an embodiment of the present disclosure.

In some embodiments described below, eight-lane SerDes core instances each include eight differential Tx pairs, eight differential Rx pairs, power supplies, and ground signals, although SerDes cores of different speeds and/or with a different number of lanes may also employ the concepts disclosed herein. These SerDes cores may be part of an integrated circuit die (such as integrated circuit die 104 shown in FIG. 1) that may also include a high-speed switch and/or router circuitry core within the integrated circuit. FIG. 3 illustrates a simplified functional block diagram 300 of one such architecture. In FIG. 3, one or more SerDes cores 305 may be connected to, for example, switch and/or router circuitry core 310 to provide an interface to this circuitry core. The function of the switch and/or router circuitry core 310 may be, for example, to switch or route network data (packets and the like) from a connection provided by one of the SerDes cores 305 to a connection provided by another of the SerDes cores 305. Although only a single Tx and Rx signal line is shown associated with each of the SerDes cores 305, it should be recognized that each of the SerDes cores 305 may have multiple Tx and Rx signal lines. For example, in some embodiments, each of the SerDes cores 305 may have eight differential Tx pairs and eight differential Rx pairs. In addition, power supply and ground connections, which may be required for operation of the circuitry in each of the SerDes cores 305, are not shown in FIG. 3.

Figure 4:
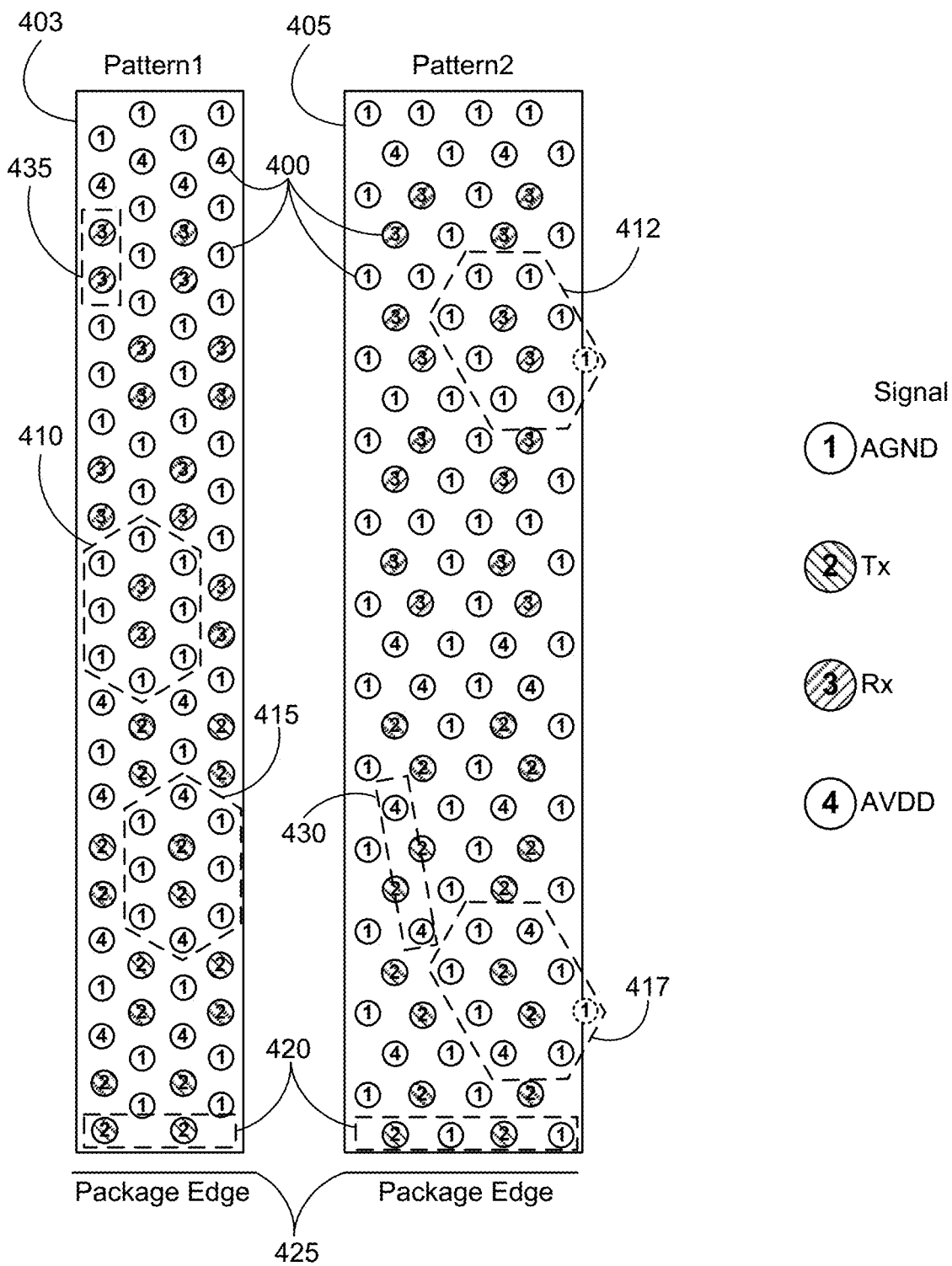
FIG. 4 illustrates connection patterns according to some embodiments of the present disclosure.

FIG. 4 illustrates connection patterns according to embodiments of the present disclosure. In the embodiments shown in FIG. 4, the connective elements 400 (solder balls, pins, etc.) may be arranged in a staggered or hexagonal pattern. The use of a hexagonal pattern may increase connection density by approximately 13% over a traditional rectangular (square) pattern. Additionally, in a hexagonal pattern, each connection point is equidistant from each of its six nearest neighbors. FIG. 4 illustrates two hexagonal connection patterns—pattern1 403 may be used along the left and right edges of a device package, while pattern2 405 may be used at the top and bottom edges of a device package.

Figure 5:
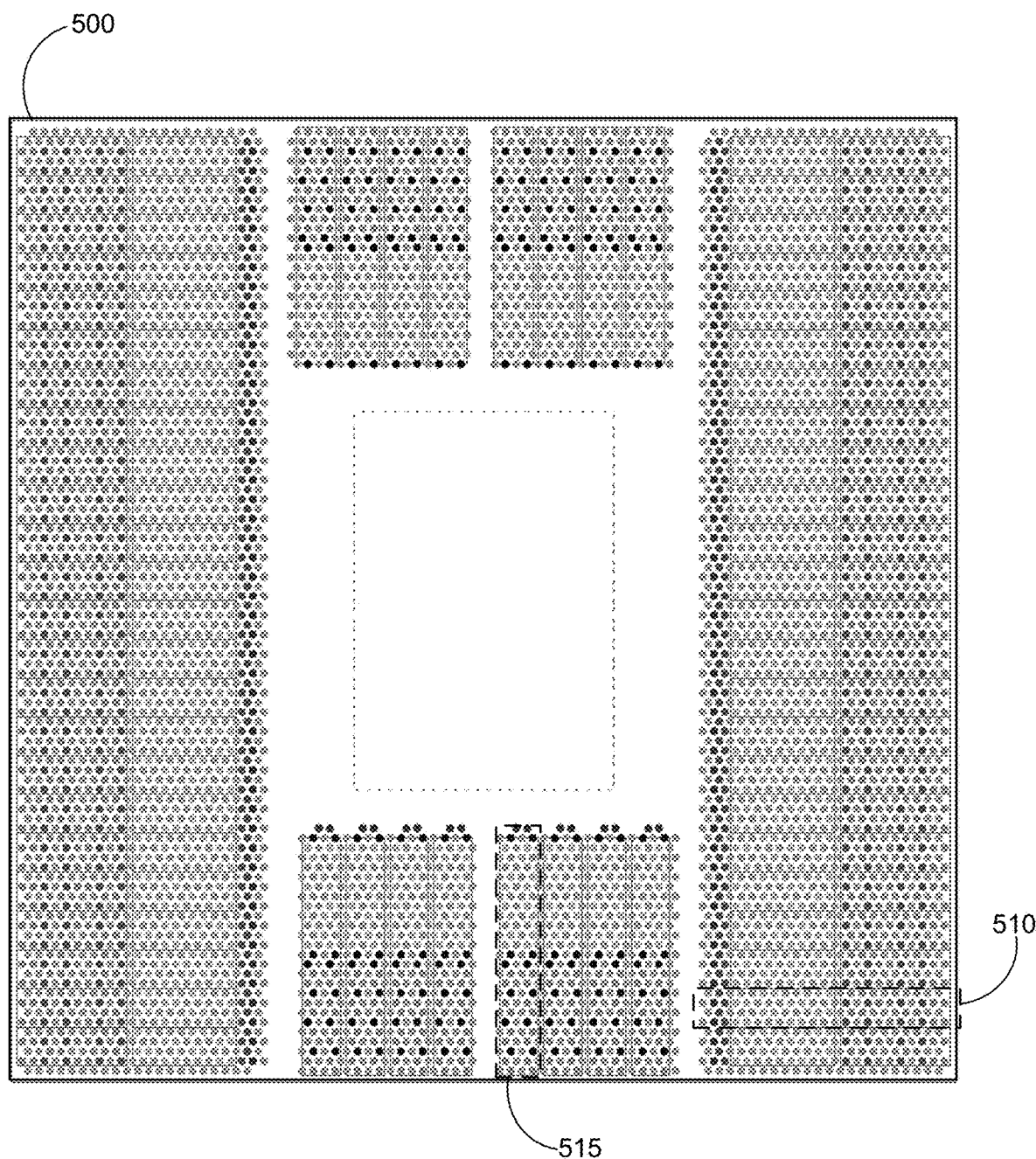
FIG. 5 illustrates a bottom view of a device package according to some embodiments of the present disclosure.

FIG. 5 illustrates a bottom view of a device package 500 according to some embodiments of the present disclosure. In FIG. 5, pattern1 510 is one of a plurality of pattern1s along the left and right edges of the device package 500, while pattern2 515 is one of a plurality of pattern2s along the top and bottom edges of the device package 500.

Returning again to FIG. 4, the signal connections may be arranged in each of the connection patterns to ensure high signal integrity. The connection patterns 403 and 405 may be used, for example, to interface to eight-lane 400 Gbps SerDes cores. These connection patterns may follow one or more specific design rules to help the connection patterns meet required signal integrity specifications. Not all connection patterns need to follow the same rule or rules, and whether or not a given rule applies may depend on a speed threshold or other decision factors. For example, each Rx pair may be surrounded (isolated) by analog ground (AGND) connections (shown, for example, as dashed areas 410 and 412) and/or analog supply voltage (AVDD) connections. Additionally, each Tx pair may be surrounded (isolated) by a combination of analog ground (AGND) and analog supply voltage (AVDD) connections (shown, for example, as dashed area 415 and 417). To reduce EMI and Common Mode Return Loss, AVDD connections may be avoided in the outermost connection rows (adjacent to the package edge). Either the Tx or the Rx connections may be placed adjacent to the package edge.

Example design rules are described in the following table:

| Connection Pattern Design Rules | |
|---|---|
| Rule | Explanation |
| Rx pair placement | Rx pairs, which tend to carry weak received signals, are in a non-adjacent configuration, having isolation with respect to Tx pairs and other Rx pairs and may also have surrounding (nearest neighbor) isolation 410 & 412 in which the Rx pairs are surrounded by ground, power, or a combination or ground and power. |
| Tx pair placement | Tx pairs, which tend to carry strong transmit signals, may have surrounding (nearest neighbor) isolation 415 & 417, in which the Tx pairs are surrounded by ground, power, or a combination or ground and power. |
| Package Edge | There are no AVDD connections in the edge row 420 of the connection pattern that runs along the package edge 425, to help achieve improved EMI and CM RL performance. |
| AVDD placement | For certain designs above a speed threshold, this rule may restrict or limit the connection pattern so that some or all AVDD connections are adjacency-free 430. That is, no AVDD connection of one magnitude may be adjacent to a AVDD connection of a different magnitude. This rule may reduce or minimize AVDD plane resonance. |

The connection pattern design rules shown above may apply within each individual group of connection patterns 403 and 405, but also, in some embodiments, apply to the overall connection patterns of adjacently arranged groups such as those shown in FIG. 5. So, for example, an Rx pair 435 in FIG. 4 at the left edge of a group is isolated from other Rx pairs when another group is positioned to the left of the connection pattern 403 illustrated.

The description above has been provided to allow a person skilled in the art to make and use the claimed inventions. The principles described above may be modified, and the principles and their variations may be applied to achieve other connection patterns and achieve other design goals. For example, given the design rules expressed above, many other permutations of connection points that form connection patterns may be implemented that also meet any given set of signal specifications. That is, the description and drawings provide examples of the inventions, and the inventions are not limited to only the specific examples provided.

To the extent that the above descriptions may be deemed to describe separate embodiments, the organization of the description into embodiments is merely for ease of understanding of the inventive concepts described herein. As such the features of each embodiment may be combined with features of the other embodiments without limitation. Obviously, numerous modifications and variations of the present invention are possible in light of the above teachings. It is therefore to be understood that within the scope of the appended claims, the invention may be practiced otherwise than as specifically described herein.

The invention claimed is:

1. A connection pattern for a semiconductor package comprising:
a plurality of connective elements, arranged in a hexagonal pattern, comprising:
a plurality of power supply elements;
a plurality of ground elements;
one or more pairs of transmit elements; and
one or more pairs of receive elements, each of which is separated from other pairs of receive elements and from all of the one or more pairs of transmit elements by one or more of the ground elements, the power supply elements or both.

2. The connection pattern of claim 1 wherein each of the one or more pairs of transmit elements is separated from other pairs of transmit elements and from all of the one or more pairs of receive elements by one or more of the ground elements, the power elements or both.

3. The connection pattern of claim 1 wherein each of the plurality of power supply elements of one magnitude is separated from each of the other power supply elements of other magnitudes by at least one of a ground element, a pair of transmit elements and a pair of receive elements.

4. The connection pattern of claim 1, wherein each of the one or more pairs of receive elements are assigned to a receive lane of a serializer/deserializer (SerDes) circuit, and each of the one or more pairs of transmit elements are assigned to a transmit lane of the SerDes circuit.

5. The connection pattern of claim 1, wherein the plurality of connective elements includes an edge row configured to run adjacent to an edge of the semiconductor package, where none of the plurality of power supply elements are in the edge row.

6. The connection pattern of claim 1, wherein there are eight pairs of receive elements, each pair of receive elements assigned to one of eight receive lanes of a serializer/deserializer (SerDes) circuit and there are eight pairs of transmit elements, each pair of transmit elements assigned to one of eight transmit lanes of the SerDes circuit.

7. The connection pattern of claim 6, wherein the SerDes circuit is communicatively connected to a packet switch.

8. The connection pattern of claim 6, wherein the SerDes circuit is communicatively connected to a packet router.

9. A connection pattern for a semiconductor package comprising:
a plurality of connective elements, arranged in a hexagonal pattern, comprising:
a plurality of power supply elements;
a plurality of ground elements;
one or more pairs of transmit elements; and
one or more pairs of receive elements;
the plurality of connective elements including:
an edge row configured to run adjacent to a semiconductor package edge; and
where none of the plurality of power supply elements are in the edge row.

10. The connection pattern of claim 9, where:
the plurality of power supply elements comprise individual power supply connective elements, and:
each power supply connective element among the plurality of power supply elements of one magnitude is in an adjacency free configuration with respect to each of the other power supply connective elements of other magnitudes among the plurality of power supply elements.

11. A device comprising:
a group of interconnecting circuit layers;
an integrated circuit die bonded to a first surface of the group of interconnecting circuit layers;
an array of hexagonally arranged electrically conductive connective elements, on a second surface of the group of interconnecting circuit layers, wherein the electrically conductive connective elements are organized into a plurality of groups of electrically conductive connective elements, wherein one or more of the groups of electrically conductive connective elements each comprise:
a plurality of power supply elements;
a plurality of ground elements;
one or more pairs of transmit elements; and
one or more pairs of receive elements, each of which is separated from other pairs of receive elements and from all of the one or more pairs of transmit elements by one or more of ground elements, power supply elements or both; and
wherein the one or more pairs of receive elements in a first group of the one or more groups of electrically conductive connective elements is separated from pairs of receive elements in an adjacent group of the one or more groups of electrically conductive connective elements.

12. The device of claim 11, wherein each of the one or more pairs of transmit elements is separated from other pairs of transmit elements and from all of the one or more pairs of receive elements by one or more of ground elements, power elements or both.

13. The device of claim 11, wherein each of the plurality of power supply elements of one magnitude is separated from each of the other power supply elements of other magnitudes by at least one of a ground element, a pair of transmit elements and a pair of receive elements.

14. The device of claim 11, wherein each of the one or more pairs of receive elements is separated from pairs of receive elements and pairs of transmit elements located in an adjacent group of electrically conductive connective elements by one or more of ground elements, power supply elements or both.

15. The device of claim 11, wherein the electrically conductive connective elements includes an edge row configured to run adjacent to an edge of the second surface of the group of interconnecting circuit layers, where none of the plurality of power supply elements are in the edge row.

16. The device of claim 11, wherein each of the one or more pairs of receive elements are assigned to a receive lane of a serializer/deserializer (SerDes) circuit, and each of the one or more pairs of transmit elements are assigned to a transmit lane of the SerDes circuit.

17. The device of claim 11, wherein there are eight pairs of receive elements, each pair of receive elements assigned to one of eight receive lanes of a serializer/deserializer (SerDes) circuit and there are eight pairs of transmit elements, each pair of transmit elements assigned to one of eight transmit lanes of the SerDes circuit.

18. The device of claim 16, wherein the SerDes circuit is communicatively connected to a packet switch.

19. The device of claim 16, wherein the SerDes circuit is communicatively connected to a packet router.

20. The device of claim 11, wherein at least one of the plurality of power supply elements of one magnitude is separated from each of the other power supply elements of other magnitudes by at least one of a ground element, a pair of transmit elements and a pair of receive elements.

\* \* \* \* \*